United States Patent
Li et al.

(10) Patent No.: US 10,324,550 B2
(45) Date of Patent: Jun. 18, 2019

(54) DRIVING METHOD, DRIVER CIRCUIT AND DESIGN METHOD OF DRIVER CIRCUIT FOR IN-CELL TOUCH DISPLAY PANEL

(71) Applicant: Wuhan China Star Optoelectronics Technology Co., Ltd., Wuhan (CN)

(72) Inventors: Man Li, Wuhan (CN); Jiehui Qin, Wuhan (CN); Jinjie Zhou, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 304 days.

(21) Appl. No.: 15/117,455

(22) PCT Filed: Jul. 15, 2016

(86) PCT No.: PCT/CN2016/090112
§ 371 (c)(1),
(2) Date: Aug. 9, 2016

(87) PCT Pub. No.: WO2017/215069
PCT Pub. Date: Dec. 21, 2017

(65) Prior Publication Data
US 2018/0203550 A1    Jul. 19, 2018

(30) Foreign Application Priority Data
Jun. 12, 2016 (CN) .......................... 2016 1 0417491

(51) Int. Cl.
*G06F 3/041* (2006.01)
*G02F 1/1333* (2006.01)
(Continued)

(52) U.S. Cl.
CPC .......... *G06F 3/0412* (2013.01); *G02F 1/1333* (2013.01); *G02F 1/13338* (2013.01);
(Continued)

(58) Field of Classification Search
CPC combination set(s) only.
See application file for complete search history.

(56) References Cited

U.S. PATENT DOCUMENTS

2009/0256818 A1* 10/2009 Noguchi ............. G02F 1/13338
345/174
2015/0160766 A1* 6/2015 Park ..................... G09G 3/3677
345/173
(Continued)

FOREIGN PATENT DOCUMENTS

| CN | 103943083 A | 7/2014 |
|---|---|---|
| CN | 104035230 A | 9/2014 |
| CN | 104537978 A | 4/2015 |

*Primary Examiner* — Hong Zhou
(74) *Attorney, Agent, or Firm* — Leong C. Lei

(57) ABSTRACT

The invention provides a driving method, driver circuit and designing method of driver circuit for in-cell touch display panel. The driving method comprises: Step 10: connecting all horizontal scan lines of the touch display panel to a first GOA circuit, the first GOA circuit performing display scanning according to a preset timing sequence; Step 20: after completing each time of TP scanning according to preset timing sequence, a first horizontal scan line in a following scanning according to preset timing sequence still connected to a second GOA circuit, the second and first GOA circuits synchronously performing display scanning to the first horizontal scan line. The driving method, driver circuit and design method of driver circuit for in-cell touch display panel provided by the invention solve the dark line problem appearing in time-sharing scanning between display and TP terms for in-cell touch display panel, and improve display quality.

8 Claims, 4 Drawing Sheets

(51) Int. Cl.
*G02F 1/1345* (2006.01)
*G02F 1/1362* (2006.01)
*G06F 17/50* (2006.01)
*G09G 3/20* (2006.01)
*G02F 1/1368* (2006.01)

(52) U.S. Cl.
CPC .... *G02F 1/13454* (2013.01); *G02F 1/136286* (2013.01); *G06F 3/0416* (2013.01); *G06F 17/5009* (2013.01); *G06F 17/5077* (2013.01); *G09G 3/20* (2013.01); *G02F 1/1368* (2013.01); *G09G 2310/0267* (2013.01); *G09G 2310/0281* (2013.01); *G09G 2354/00* (2013.01)

(56) References Cited

U.S. PATENT DOCUMENTS

2015/0355767 A1* 12/2015 Abe ................ G06F 3/0412 345/174
2016/0224175 A1* 8/2016 Moon ............... G06F 3/0412

* cited by examiner

DRIVING METHOD, DRIVER CIRCUIT AND DESIGN METHOD OF DRIVER CIRCUIT FOR IN-CELL TOUCH DISPLAY PANEL

BACKGROUND OF THE INVENTION

1. Field of the Invention

The present invention relates to the field of display, and in particular to a driving method, driver circuit and design method of driver circuit for in-cell touch display panel.

2. The Related Arts

As the display technology rapidly develops, the touch display panel is widely accepted and used in many applications, such as, smart phone, panel PC. The touch display panel uses embedded touch control technology to integrate the touch control panel with liquid crystal display (LCD) panel, and embed the functions of touch control panel into the LCD panel so that the LCD panel can both display and detect the touch control input.

To realize the thin design of electronic products, the display screens used in the smart phones and panel PCs are mostly capacitive touch control screens. Based on the structure, the capacitive touch control screens can be categorized into on-cell type, hybrid in-cell type and full in-cell type, wherein the on-cell type has the touch control electrodes on the liquid crystal (LC) box (i.e., cell), the hybrid in-cell type has the touch control electrodes in the LC box, and the full in-cell type also has the touch control electrodes in the LC box. Comparing the last type to the other two types, the full in-cell type enables further better thin design in the display screen. The hybrid in-cell and full in-cell type touch display panels are both touch display panel with the touch control electrode embedded in the LC box, and provide advantages of lower cost, ultra-thin design and narrow border, and are mainly for high-end products. As such, the in-cell type is evolved to become the mainstream for future touch control technology.

On the other hand, the operating principle of the LC panel is as follows: disposing LC molecules between two parallel glass substrates, and applying a driving voltage on the two glass substrates to control the rotation direction of the LC molecules to reflect the light emitted from the backlight module to display images. In the active LCD panel, each pixel comprises a thin film transistor (TFT), with the gate connected to a horizontal scan line (gate line), the drain connected to a vertical data line, and the source connected a pixel electrode. By applying a sufficient voltage to the horizontal scan line, all the TFTs on the line will be turned on so that the pixel electrode of the horizontal scan line will be connected to the vertical data line so as to write the display signal on the data line into the pixel to control the transmittance of the different LCs to achieve color control. At present, the common approach is to manufacture the driver circuit of the horizontal scan line in the gate-on-array (GOA) circuit at the active area peripheral on the substrate to achieve driving the horizontal scan line.

As shown in FIG. 1 of a schematic view of driving timing sequence for a known in-cell LCD, the scan time for a frame is 16.7 ms, and the report rate of the touch control is 60 Hz. At present, for the in-cell LCD, such as full in-cell LCD, the small-to-medium size low temperature polysilicon (LTPS) LCD mainly uses display and touch panel (TP) time-sharing driving scan approach: i.e., a gate scanning N lines, followed by scanning apportion of TP, and following by another gate scanning N lines, and so on, until a frame finishes displaying. The advantage of this approach is a less interference between the display and TP.

However, as shown in FIG. 2 of a schematic view of a dark line appearing after TP scanning or a known in-cell LCD, at the handover between the display term and the TP term (i.e., display term ends and TP term starts), the gate is in a holding state of low voltage (VGL), and the source is in a holding state of ground (GND). After a long time, the current leakage will occur. After TP scanning is complete and the scanning of (N+1)-th line starts, the gate signal of the (N+1)-th line will become as shown in FIG. 3 due to the current leakage. FIG. 3 is a schematic view of the gate signal transmitted for a known in-cell LCD. At this point, the signal is distorted (serious delay for rising and falling edges). As such, the gate signal of the (N+1)-th line is insufficient to push the (N+1)-th pixel to fully charged, leading to a lower luminance of the (N+1)-th line and resulting in a dark line.

FIG. 4 is a schematic view showing the known the GOA single side driving circuit. In the current small-to-medium size LCDs, the gate driving structure is mostly a single-sided GOA driving. The GOA circuit 1 is connected to each horizontal line and scan the gate of the first line, the gate of the second line, . . . , the gate of the N-th line, the gate of the (N+1)-th line . . . , respectively, following the preset timing sequence.

Therefore, it is desirable to provide a new driving structure to address the dark line problem appears in the time-sharing scanning between display and TP terms in the in-cell touch display panel.

SUMMARY OF THE INVENTION

The object of the present invention is to provide a driving method for in-cell touch display panel, able to solve the problem of the dark line problem appearing in the time-sharing scanning between display and TP terms in the in-cell touch display panel, and to improve display quality.

Another object of the present invention is to provide a driver circuit for in-cell touch display panel, able to solve the problem of the dark line problem appearing in the time-sharing scanning between display and TP terms in the in-cell touch display panel, and to improve display quality.

Yet another object of the present invention is to provide a designing method for the driver circuit for in-cell touch display panel, able to solve the problem of the dark line problem appearing in the time-sharing scanning between display and TP terms in the in-cell touch display panel, and to improve display quality.

To achieve the above object, the present invention provides a driving method for in-cell touch display panel, which comprises:

Step 10: connecting all horizontal scan lines of the touch display panel to a first GOA circuit, and the first GOA circuit performing display scanning according to a preset timing sequence; and Step 20: after completing each time of touch panel scanning according to the preset timing sequence, a first horizontal scan line in a following scanning according to the preset timing sequence being still connected to a second GOA circuit, the second GOA circuit and the first GOA circuit synchronously performing display scanning to the first horizontal scan line.

In a preferred embodiment, the touch display panel is a hybrid in-cell LCD.

In a preferred embodiment, the touch display panel is a full in-cell LCD.

In a preferred embodiment, the first GOA circuit and the second GOA circuit are located respectively at two opposite sides of the touch display panel.

In a preferred embodiment, the first GOA circuit and the second GOA circuit have a thrust passing simulation confirmation in advance.

To achieve the above object, the present invention also provides a driver circuit for in-cell touch display panel, which comprises: a first GOA circuit, and a second GOA circuit; the first GOA circuit being connected to all horizontal scan lines of the touch display panel, and performing display scanning according to a preset timing sequence; and after completing each time of touch panel scanning according to the preset timing sequence, a first horizontal scan line in a following scanning according to the preset timing sequence being still connected to the second GOA circuit, the second GOA circuit and the first GOA circuit synchronously performing display scanning to the first horizontal scan line.

In a preferred embodiment, the first GOA circuit and the second GOA circuit are located respectively at two opposite sides of the touch display panel.

In a preferred embodiment, the first GOA circuit and the second GOA circuit have a thrust passing simulation confirmation in advance.

To achieve the above object, the present invention also provides a designing method of driver circuit for in-cell touch display panel, which comprises:

finding dark line locations of all horizontal scan lines of the touch display panel according to a preset timing sequence;

setting a mask condition, designing the horizontal scan lines corresponding to the dark line locations to be driven synchronously by a first GOA circuit and a second GOA circuit, and the remaining horizontal scan lines being driven by only the first GOA circuit;

the first GOA circuit and the second GOA circuit have a thrust passing simulation confirmation in advance.

In a preferred embodiment, the first GOA circuit and the second GOA circuit are located respectively at two opposite sides of the touch display panel.

In summary, the driving method, driver circuit and design method of driver circuit for in-cell touch display panel provided by the present invention solve the dark line problem appearing in the time-sharing scanning between display and TP terms in the in-cell touch display panel, and improve display quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
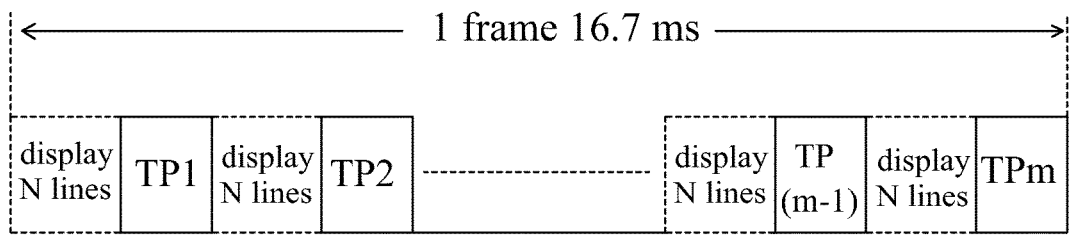
FIG. 1 is a schematic view showing the driving timing sequence for a known in-cell LCD.
Figure 2:
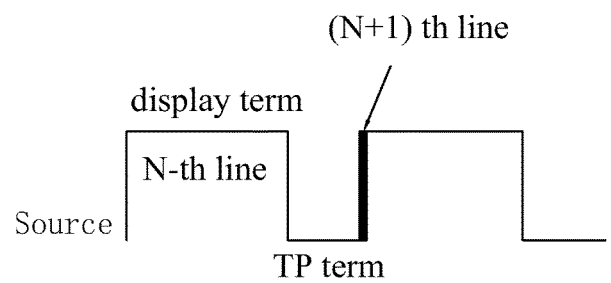
FIG. 2 is a schematic view showing the dark line appearing after TP scanning for a known in-cell LCD.
Figure 5:
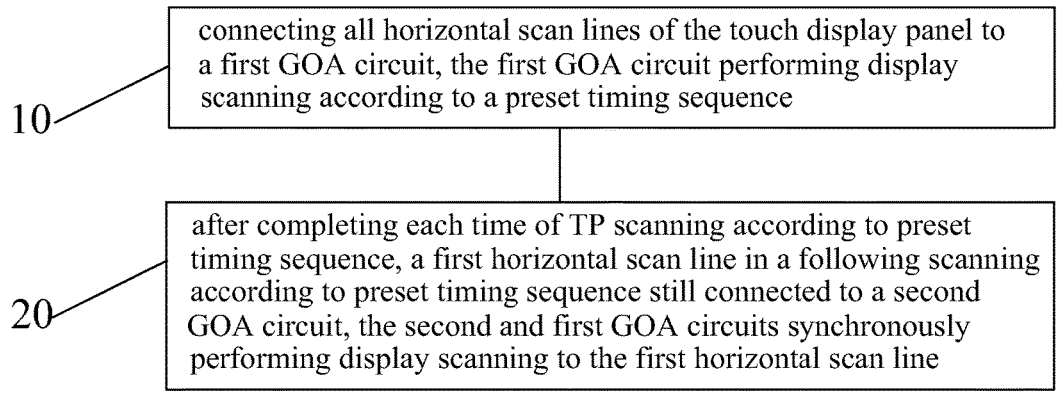
FIG. 5 is a schematic view showing the flowchart of the driving method for in-cell touch display panel provided by an embodiment of the present invention.

Refer to FIG. 5. The present invention provides a driving method for in-cell touch display panel, which comprises:

Step 10: connecting all horizontal scan lines of the touch display panel to a first GOA circuit, and the first GOA circuit performing display scanning according to a preset timing sequence. For the known in-cell touch display panel, the preset timing sequence can be as shown in FIG. 1, i.e., comprising time-sharing between touch panel scanning and display scanning. In the present invention, the touch display panel can be any in-cell touch display panel, such as, hybrid in-cell touch display panel or full in-cell touch display panel.

Step 20: after completing each time of touch panel scanning according to the preset timing sequence, a first horizontal scan line in a following scanning according to the preset timing sequence being still connected to a second GOA circuit, the second GOA circuit and the first GOA circuit synchronously performing display scanning to the first horizontal scan line.

The thrust of the first GOA circuit and the second GOA circuit can pass simulation confirmation in advance, such as, luminance simulation and panel layout circuit simulation of the optical portion of the touch display panel.

Figure 4:
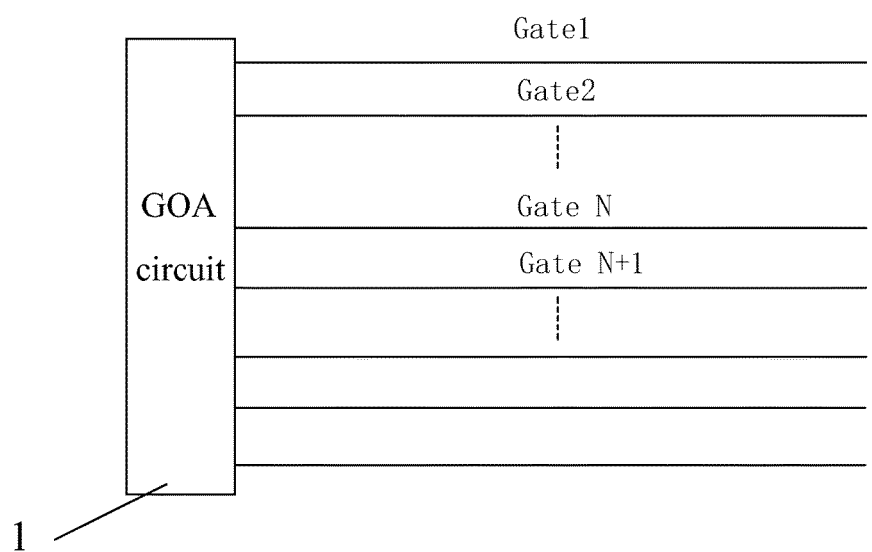
FIG. 4 is another schematic view showing a known GOA single-sided circuit.

The present invention begins with increasing the GOA thrust of the display column with dark lines to solve dark line caused by the insufficient charge of the gate signal due to current leakage. A shown in FIG. 4, the known gate driving structure for small-to-medium size LCD is mostly single-sided GOA driving, and the present invention uses doubled-sized driving for the dark lines with serious current leakage to increase the thrust to improve the charging capability, leading to improved luminance.

Figure 6:
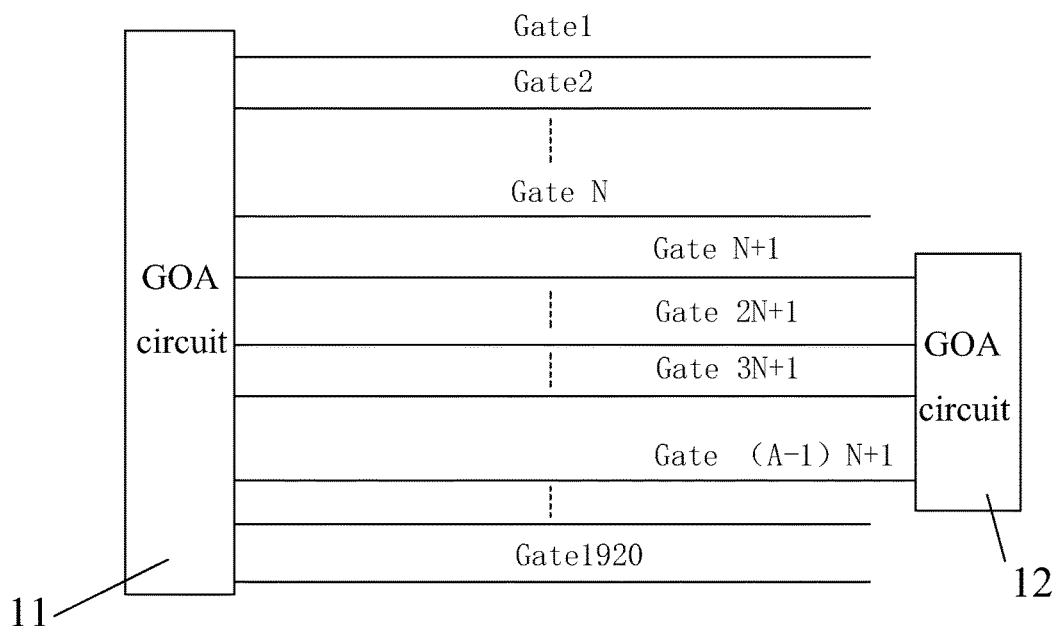
FIG. 6 is a schematic view showing the driver circuit for in-cell touch display panel provided by a preferred embodiment of the present invention.

Refer to FIG. 6. FIG. 6 is a schematic view showing a preferred embodiment of the driver circuit for the in-cell touch display panel, which comprises: which comprises: a first GOA circuit 11, and a second GOA circuit 12; the first GOA circuit 11 being connected to all horizontal scan lines of the touch display panel, and performing display scanning according to a preset timing sequence; and after completing each time of touch panel scanning according to the preset timing sequence, a first horizontal scan line in a following scanning according to the preset timing sequence being still connected to the second GOA circuit 12, the second GOA circuit 12 and the first GOA circuit 11 synchronously performing display scanning to the first horizontal scan line. In this preferred embodiment, the first GOA circuit 11 and the second GOA circuit 12 are located respectively on two opposite sides of the touch display panel to simplify the routing layout.

Also refer to FIG. 6. For the time-sharing scanning in-cell touch display panel, each first line after completing TP scanning has a darker display. Because TP scanning is suspended A times, the entire screen will show A-1 dark lines. If N lines are displayed each time, the A-1 dark lines appear at (N+1)-th line, (2N+1)-th line, . . . , ((A-1)N+1)-th line. The present invention only needs to perform double-sided driving for those suspended lines. For example, for a 5-in phone display with a 10801920 resolution, a TP scanning is performed for every displaying of 120 lines, which requires 15 suspensions. Therefore, the second GOA circuit 12 is added to the right side of the screen to drive these 15 scan lines.

The present invention also provides a designing method of driver circuit for in-cell touch display panel, which comprises:

(1) finding dark line locations of all horizontal scan lines of the touch display panel according to a preset timing sequence. For the in-cell touch display panel performing scanning according to preset timing sequence, each first line after completing TP scanning has a darker display. Because TP scanning is suspended A times, the entire screen will show A-1 dark lines. If N lines are displayed each time, the A-1 dark lines appear at (N+1)-th line, (2N+1)-th line, . . . , ((A-1)N+1)-th line.

(2) setting a mask condition, designing the horizontal scan lines corresponding to the dark line locations to be driven synchronously by a first GOA circuit and a second GOA circuit, and the remaining horizontal scan lines being driven by only the first GOA circuit. Compared to the known single-sided driving, the present invention uses double-sided driving for GOA circuit for the gate lines with dark line, and uses single-sided driving for the remaining gate lines.

(3) the thrust of the first GOA circuit and the second GOA circuit can pass simulation confirmation in advance, such as, luminance simulation and panel layout circuit simulation of the optical portion of the touch display panel.

Figure 3:
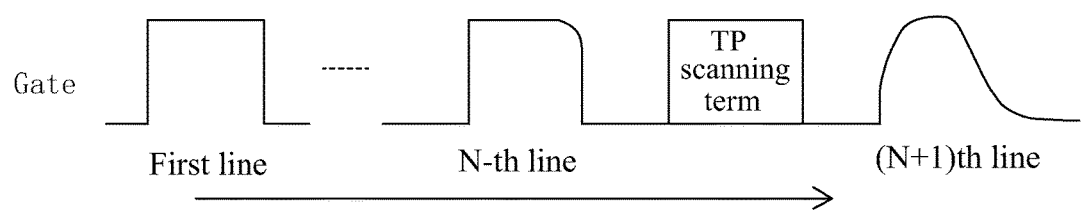
FIG. 3 is a schematic view showing the gate signal transmitted in a known in-cell LCD.
Figure 7:
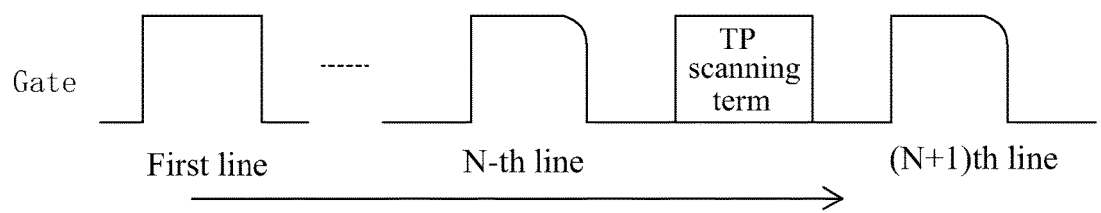
FIG. 7 is schematic view showing the data transmission after compensated by the driving method for in-cell touch display panel provided by a preferred embodiment of the present invention.

Refer to FIG. 7. FIG. 7 is a schematic view showing the data transmission after compensated by the driving method for the in-cell touch display panel of the present invention. Comparing FIG. 7 and FIG. 3, it is shown that the present invention has avoided the signal distortion and the rising and falling edges are no longer delayed. The present invention, by increasing the GOA thrust of the lines with dark lines, solves the dark line problem caused by the insufficient charging due to Gate signal current leakage. By compensating the dark lines generated by the current leakage because of the suspension for TP scanning, the display quality if improved.

In summary, the driving method, driver circuit and design method of driver circuit for in-cell touch display panel provided by the present invention solve the dark line problem appearing in the time-sharing scanning between display and TP terms in the in-cell touch display panel, and improve display quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A driving method for in-cell touch display panel, which comprises:
    connecting all horizontal scan lines of the touch display panel to a first gate on array (GOA) circuit, and the first GOA circuit performing display scanning according to a preset timing sequence; and
    after completing each time of touch panel scanning according to the preset timing sequence, a first horizontal scan line in a following scanning according to the preset timing sequence being still connected to a second gate on array (GOA) circuit, the second GOA circuit and the first GOA circuit synchronously performing display scanning to the first horizontal scan line, wherein the first horizontal scan line is connected to both the first and second GOA circuits, while remaining ones of the horizontal scan lines are connected to the first GOA circuit only.

2. The driving method for in-cell touch display panel as claimed in claim 1, wherein the touch display panel is a hybrid in-cell LCD.

3. The driving method for in-cell touch display panel as claimed in claim 1, wherein the touch display panel is a full in-cell LCD.

4. The driving method for in-cell touch display panel as claimed in claim 1, wherein the first GOA circuit and the second GOA circuit are located respectively at two opposite sides of the touch display panel.

5. The driving method for in-cell touch display panel as claimed in claim 1, wherein the first GOA circuit and the second GOA circuit have a thrust passing simulation confirmation in advance.

6. A driver circuit for in-cell touch display panel, which comprises: a first gate on array (GOA) circuit, and a second gate on array (GOA) circuit; the first GOA circuit being connected to all horizontal scan lines of the touch display panel, and performing display scanning according to a preset timing sequence; and after completing each time of touch panel scanning according to the preset timing sequence, a first horizontal scan line in a following scanning according to the preset timing sequence being still connected to the second GOA circuit, the second GOA circuit and the first GOA circuit synchronously performing display scanning to the first horizontal scan line, wherein the first horizontal scan line is connected to both the first and second GOA circuits, while remaining ones of the horizontal scan lines are connected to the first GOA circuit only.

7. The driver circuit for in-cell touch display panel as claimed in claim 6, wherein the first GOA circuit and the second GOA circuit are located respectively at two opposite sides of the touch display panel.

8. The driver circuit for in-cell touch display panel as claimed in claim 6, wherein the first GOA circuit and the second GOA circuit have a thrust passing simulation confirmation in advance.

* * * * *